United States Patent
Flock et al.

(10) Patent No.: US 8,847,590 B2
(45) Date of Patent: Sep. 30, 2014

(54) SURFACE-MOUNTABLE MAGNETIC FIELD SENSOR HAVING A SEMICONDUCTOR CHIP AND METHOD FOR PRODUCING A CIRCUIT BOARD HAVING A MAGNETIC FIELD SENSOR

(75) Inventors: Stefan Flock, Röttenbach (DE); Uwe Krella, Nürnberg (DE); Jürgen Steger, Hiltpoltstein (DE)

(73) Assignee: Conti Temic Microelectronic GmbH, Nurnberg (DE)

( * ) Notice: Subject to any disclaimer, the term of this patent is extended or adjusted under 35 U.S.C. 154(b) by 342 days.

(21) Appl. No.: 13/255,994

(22) PCT Filed: Mar. 5, 2010

(86) PCT No.: PCT/EP2010/052800
§ 371 (c)(1),
(2), (4) Date: Sep. 12, 2011

(87) PCT Pub. No.: WO2010/102951
PCT Pub. Date: Sep. 16, 2010

(65) Prior Publication Data
US 2012/0001627 A1    Jan. 5, 2012

(30) Foreign Application Priority Data
Mar. 13, 2009 (DE) .................. 10 2009 013 114

(51) Int. Cl.
*G01R 33/07* (2006.01)
*G01R 33/00* (2006.01)
*G01R 33/09* (2006.01)

(52) U.S. Cl.
CPC ........ *G01R 33/0047* (2013.01); *G01R 33/0052* (2013.01); *G01R 33/091* (2013.01); *H01L 2224/48247* (2013.01); *H01L 2224/32245* (2013.01); *H01L 2224/73265* (2013.01); *H01L 2224/48091* (2013.01)
USPC ........................................................ 324/251

(58) Field of Classification Search
USPC ........................................................ 324/251
See application file for complete search history.

(56) References Cited

U.S. PATENT DOCUMENTS

| 5,444,294 A | 8/1995 | Suzuki .......................... 257/666 |
| 2008/0030190 A1 | 2/2008 | Ishihara et al. ................ 324/244 |

FOREIGN PATENT DOCUMENTS

| DE | 10051472 A1 | 5/2002 | ............. H05K 5/00 |
| DE | 10051472 B4 | 5/2002 | ............. H01R 13/52 |
| DE | 10143437 A1 | 3/2003 | ............. F16H 59/04 |
| DE | 102006057970 A1 | 6/2008 | ............. H01L 43/00 |

OTHER PUBLICATIONS

International PCT Search Report and Written Opinion, PCT/EP2010/052800, 15 pages, May 26, 2010.

*Primary Examiner* — Reena Aurora
(74) *Attorney, Agent, or Firm* — King & Spalding L.L.P.

(57) ABSTRACT

A surface-mountable magnetic field sensor (1) with a semiconductor chip (4), a magnetic field measuring device (30), and in a method for producing and populating a circuit board (24) having a magnetic field sensor (1), the magnetic field sensor (1) has a semiconductor chip (4), which is arranged on a flat-conductor substrate (5). At least three flat-conductor electrodes (6 to 9), which protrude out of a plastic housing side (10), are electrically connected to the semiconductor chip (4). The flat-conductor substrate (5) and the semiconductor chip (4) are embedded in a plastic housing (11). The plastic housing (11) can be inserted with the embedded semiconductor chip (4) into a magnetic field gap (12), with the flat-conductor electrodes (6 to 9) protruding, wherein the flat-conductor electrodes (6 to 9) have bends (13 to 16) at a distance from the plastic housing side (10), the bends being surface-mountable on a circuit board.

19 Claims, 10 Drawing Sheets

Prior Art

Prior Art

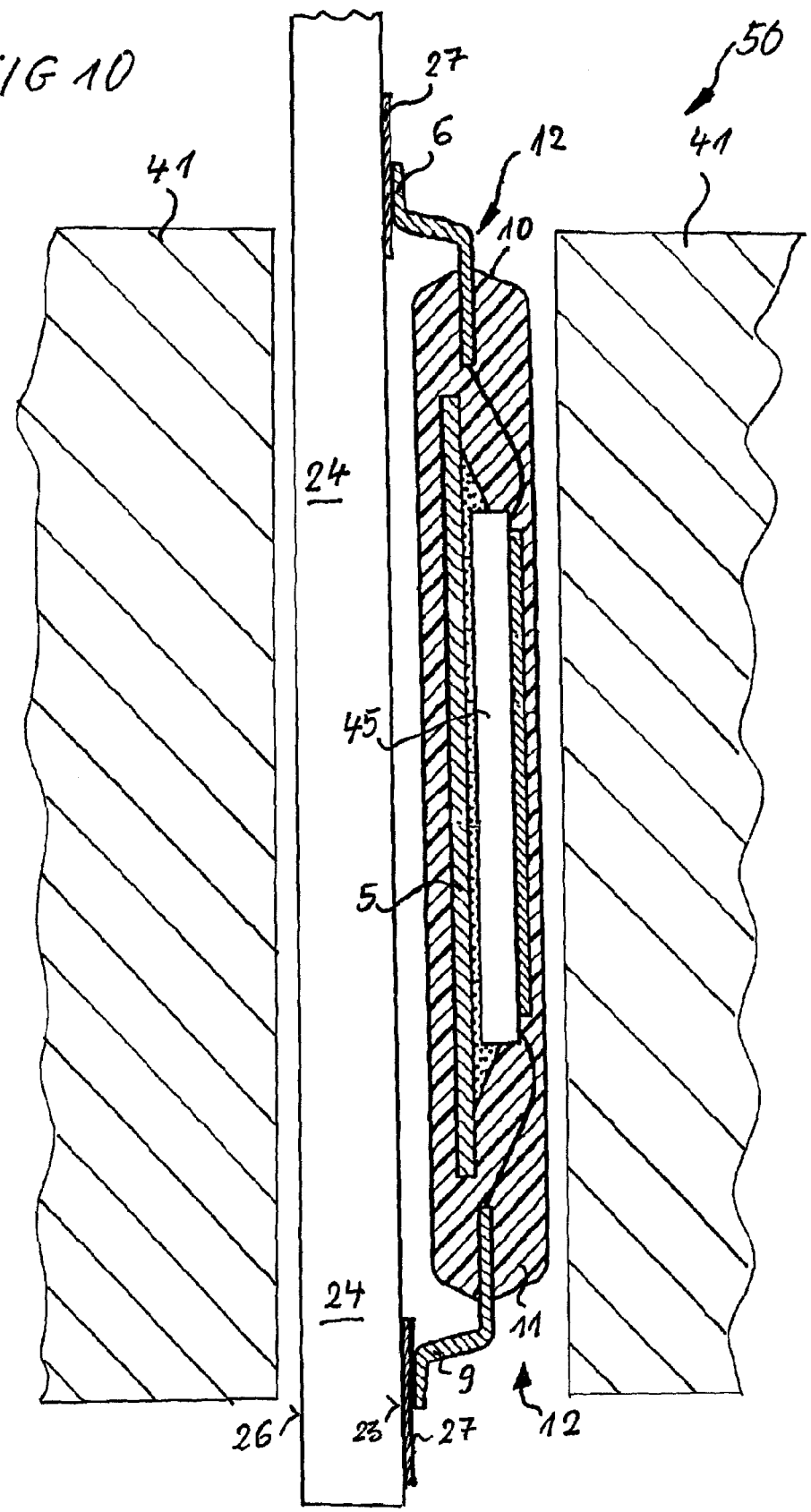

US 8,847,590 B2

SURFACE-MOUNTABLE MAGNETIC FIELD SENSOR HAVING A SEMICONDUCTOR CHIP AND METHOD FOR PRODUCING A CIRCUIT BOARD HAVING A MAGNETIC FIELD SENSOR

CROSS-REFERENCE TO RELATED APPLICATIONS

This application is a U.S. National Stage Application of International Application No. PCT/EP2010/052800 filed Mar. 5, 2010, which designates the United States of America, and claims priority to German Application No. 10 2009 013 114.0 filed Mar. 13, 2009, the contents of which are hereby incorporated by reference in their entirety.

TECHNICAL FIELD

The invention relates to a surface-mountable magnetic field sensor comprising a semiconductor chip, and to a magnetic field measuring device and to a method for producing and populating a circuit board with a magnetic field sensor. The magnetic field sensor has a semiconductor chip arranged on a flat-conductor substrate. At least three flat-conductor electrodes protruding from a plastic housing side are electrically connected to the semiconductor chip.

BACKGROUND

FIG. 8 shows a schematic perspective view of such a magnetic field sensor 3. From a plastic housing side 10, four flat conductors 6 to 9 protrude from a plastic housing 11. Arranged in the plastic housing 11 is a semiconductor chip 4, the position of which in the housing 11 is shown by dashed lines in FIG. 8. Four contact pads 32 to 35 are arranged on the top side of the semiconductor chip 4, said contact pads being electrically connected to the flat-conductor electrodes 6 to 9 by means of corresponding connecting elements 36 to 39 within the plastic housing 11. If a current is impressed between the flat-conductor electrodes 6 and 9 and the plastic housing 11 is positioned with the semiconductor chip 4 in a magnetic field gap, then a measurement voltage dependent on the magnetic field strength in the magnetic field gap and on the impressed current occurs at the flat-conductor electrodes 7 and 8 as measuring electrodes. In order, from a circuit board, to introduce such a magnetic field sensor 3 into a magnetic field gap, through-contact openings are to be provided in the circuit board in order to electrically connect the printed circuit of the circuit board to the four flat-conductor electrodes. This is illustrated in FIG. 9, which shows a schematic cross section through a magnetic field measuring device 40 in accordance with the prior art. In order to measure for example the current through a lead, the latter is surrounded by a soft-magnetic ring 41 having a magnetic field gap 12, into which is inserted the magnetic field sensor 3 in accordance with FIG. 9 with its semiconductor chip 4 and the flat-conductor substrate 5, on which the semiconductor chip 4 is fixed. The circuit board 24 with its populated top side 23 and its underside 26 has a contact hole 42, into which one end 43 of the flat-conductor electrode 6 is soldered. Soldering-in and fixing four flat-conductor electrodes 6 to 9 of this type necessitates manual handling. The latter requires personnel costs and is not accessible to automatic production.

The document DE 10 2006 057 970 A1 discloses a semiconductor device comprising a magnetic field sensor, which is surface-mountable on a circuit board. A corresponding magnetic field measuring device which is possible with a surface-mountable magnetic field sensor of this type is shown in FIG. 10. In order in this case to measure the magnetic field strength in a magnetic field gap 12, it is necessary for the surface-mountable magnetic field sensor 45 to be positioned with the circuit board 24 in the gap 12, with the disadvantage that this requires a significantly wider measurement gap in the soft-magnetic ring 41. In addition, the alignment of the circuit board 24 is then predefined with the magnetic field gap 12, which is unfavorable in many applications, for which reason the embodiment in accordance with FIGS. 8 and 9 may be preferred for magnetic field sensors, which embodiment, however, precludes cost-effective surface mounting by means of, for example, an automatically operating automatic placement machine.

SUMMARY

According to various embodiments, a surface-mountable magnetic field sensor can be provided which comprises a semiconductor chip on a flat-conductor substrate and which comprises at least three flat-conductor electrodes protruding from a single plastic housing side, wherein the magnetic field sensor is intended to be surface-mountable on a circuit board with its flat-conductor electrodes by means of an automatic placement machine, while the semiconductor chip is arranged at a distance from the circuit board.

According to an embodiment, a surface-mountable magnetic field sensor may comprise a semiconductor chip on a flat-conductor substrate and may comprise at least three flat-conductor electrodes protruding from a plastic housing side, wherein the semiconductor chip and the flat-conductor substrate are embedded into the plastic housing, and wherein the plastic housing can be inserted with the embedded semiconductor chip into a magnetic field gap, with the flat-conductor electrodes protruding, and wherein the flat-conductor electrodes have bent portions at a distance from the plastic housing side, said bent portions being surface-mountable on a circuit board.

According to a further embodiment, the bent portions of the flat-conductor electrodes can be arranged in a plastic holder. According to a further embodiment, the bent portions may protrude from the plastic holder in different directions. According to a further embodiment, the plastic holder may have a coding element. According to a further embodiment, the plastic holder may have a smoothed surface region, which is smoothed for picking up the magnetic field sensor by means of a suction pipette. According to a further embodiment, the plastic holder may have an apron fitted laterally with respect to the surface region, from which apron the bent portions of the flat-conductor electrodes protrude, and wherein the apron has a bead as coding element. According to a further embodiment, the plastic holder with the coding element can be arranged in a matched opening at an angle with respect to a top side of a circuit board, and wherein the plastic housing projects at said angle from the top side of the circuit board. According to a further embodiment, the magnetic field sensor can be a Hall sensor having at least three flat-conductor electrodes having bent portions. According to a further embodiment, the plastic holder and the plastic housing may have an integral encapsulation of the flat-conductor electrodes, of the semiconductor chip and of the flat-conductor substrate, and wherein the bent portions of the flat-conductor electrodes protrude from the integral encapsulation in a surface-mountable fashion.

According to another embodiment, a magnetic field measuring device comprising a magnetic field sensor as described above, wherein the magnetic field measuring device has a side—populated with active and/or passive components—of a circuit board, into which is incorporated an opening, in which the magnetic field sensor with the plastic holder is inserted with an accurate fit and in an aligned manner, and wherein the bent portions of the flat-conductor electrodes are surface-mounted on the placement side and the plastic housing with the semiconductor chip and the flat-conductor substrate protrude from the underside and into the magnetic field gap.

According to yet another embodiment, a method for producing and populating a circuit board with a magnetic field sensor, may comprise the following method steps: —bending flat-conductor electrodes of the magnetic field sensor which protrude from a plastic housing side; —attaching or injection-molding a plastic holder onto or at the bent flat-conductor electrodes; —producing a circuit board, which can be arranged above a magnetic field gap; —introducing an opening into the circuit board, which is matched in terms of contour and size to an apron with a coding element of the magnetic field sensor; —fitting contact areas on the circuit board for the surface mounting of the bent portions of the flat-conductor electrodes; —introducing the magnetic field sensor into the opening and surface mounting of the magnetic field sensor with cohesive connection of the bent portions of the flat-conductor electrodes on the top side of the circuit board with the contact areas, in such a way that the plastic housing is arranged with a semiconductor sensor chip at a distance from the underside of the circuit board.

According to a further embodiment of the method, the magnetic field sensor can be introduced into the opening in the circuit board using an automatic placement machine, wherein a plurality of magnetic field sensors are arranged on a tray and columns and are fed to the automatic placement machine. According to a further embodiment of the method, the magnetic field sensors can be lifted from the tray by means of a vacuum pipette sucking up a smoothed surface region of the plastic holder and are fed to a placement position on a circuit board.

BRIEF DESCRIPTION OF THE DRAWINGS

The invention will now be explained in greater detail with reference to the accompanying figures.

FIG. 10 shows a schematic cross section through a conventional magnetic field measuring device with a surface-mountable further magnetic field sensor.

DETAILED DESCRIPTION

Figure 1:
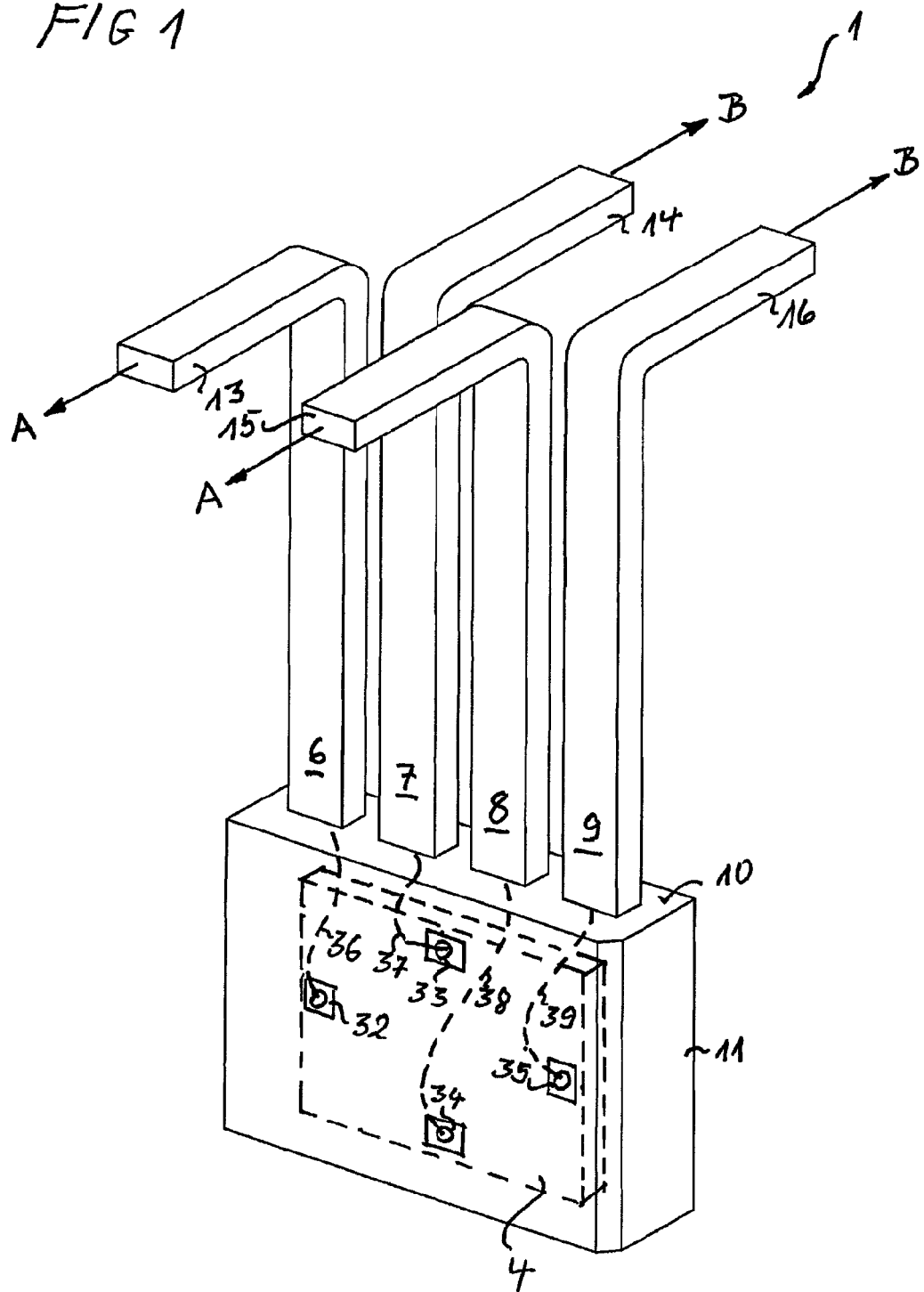
FIG. 1 shows a schematic perspective view of a magnetic field sensor with bent portions of its flat-conductor electrodes.

According to various embodiments, a surface-mountable magnetic field sensor may be provided comprising a semiconductor chip and a magnetic field measuring device, and also discloses a method for producing and populating a circuit board. The magnetic field sensor has a semiconductor chip arranged on a flat-conductor substrate. At least three flat-conductor electrodes protruding from a single plastic housing side are electrically connected to the semiconductor chip. The flat-conductor substrate and the semiconductor chip are embedded in a plastic housing. The plastic housing can be inserted with the embedded semiconductor chip into a magnetic field gap, with the flat-conductor electrodes protruding, wherein the flat-conductor electrodes have bent portions at a distance from the plastic housing side, said bent portions being surface-mountable on a circuit board. A magnetic field sensor of this type has the advantage that, on account of the bent portions of the flat-conductor electrodes, the magnetic field sensor is surface-mountable at an angle, preferably of 90°, on a circuit board, such that the semiconductor chip can be introduced into a magnetic field gap and the circuit board can be positioned outside the magnetic field gap. Furthermore, such a magnetic field sensor with bent flat-conductor electrodes has the advantage that it can be arranged on the circuit board by means of an automatic placement machine.

In one embodiment, the bent portions of the flat-conductor electrodes are arranged in a plastic holder. Said plastic holder can be fixed to the flat-conductor electrodes in such a way as to facilitate the handling of the magnetic field sensor during surface mounting.

In this case, the bent portions protrude from the plastic holder in different directions, wherein the plastic holder is fixed to the flat-conductor electrodes by means of hot caulking, ultrasonic welding or clamping.

One advantageous feature of the holder in this case is that it has a smoothed surface region, which allows the component to be picked up by means of a placement pipette of an automatic placement machine. The material of the plastic holder is preferably a plastic whose softening range and/or whose decomposition temperature lies above the customary soldering temperatures, thereby ensuring that the plastic holder is not damaged during surface mounting and surface soldering on the circuit board. In a further embodiment, the plastic holder has a coding element. Said coding element is intended to ensure that the plastic holder can be surface-mounted in a correct alignment with a circuit board.

For this purpose, the plastic holder has an apron fitted laterally with respect to the surface region, from which apron the bent portions of the flat-conductor electrodes protrude, and wherein the apron has a bead as coding element. Instead of a bead, however, it is also possible to arrange grooves or springs and/or cutouts of the lateral apron of the plastic holder.

Furthermore, it is provided that the plastic holder with the coding element is arranged in a matched opening at an angle with respect to a top side of the circuit board, and wherein the plastic housing projects at said angle from the top side of the circuit board. Said angle is preferably 90°, such that the plastic sensor housing can be arranged in a magnetic field gap vertically with respect to the circuit board.

Figure 8:
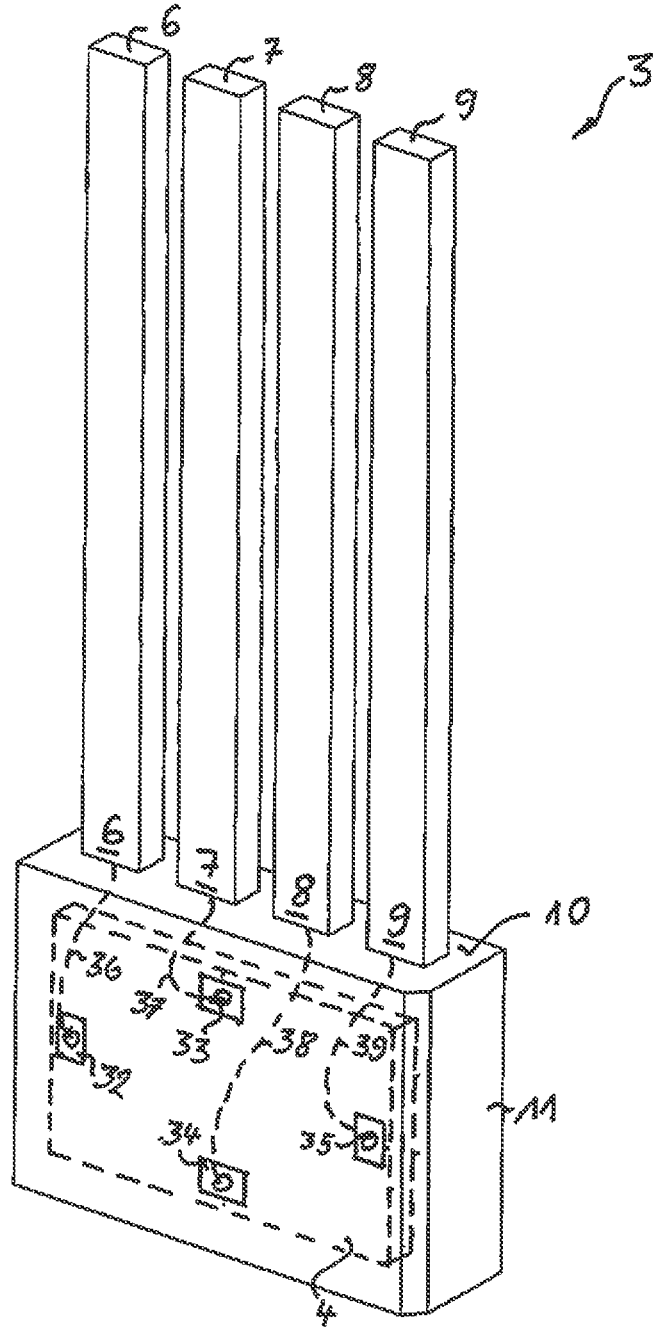
FIG. 8 shows a schematic perspective view of a first conventional magnetic field sensor.

Preferably, the magnetic field sensor is a Hall sensor having four flat-conductor electrodes having bent portions, which are electrically connected to a respective edge side of the four edges of the Hall sensor, as is known from the prior art in accordance with FIG. 8.

Furthermore, it is provided that the plastic holder and the plastic housing have an integral encapsulation of the flat-conductor electrodes of the semiconductor chip and of the flat-conductor substrate, wherein the bent portions of the flat-conductor electrodes protrude from the integral encapsulation in a surface-mountable fashion. In this embodiment of the magnetic field sensor, a plastic holder to be fixed can be dispensed with, since the function of the plastic holder is then performed by said encapsulation, which practically forms a new plastic housing for the magnetic field sensor.

A magnetic field measuring device comprising a magnetic field sensor according to various embodiments has a side—populated with active and/or passive components—of a circuit board, into which is incorporated an opening, in which the magnetic field sensor with the plastic holder is inserted with an accurate fit and in an aligned manner. In this case, the bent portions of the flat-conductor electrodes are surface-mounted on the placement side and the plastic housing with the semiconductor chip and the flat-conductor substrate protrude from the underside of the circuit board and into the magnetic field gap. A magnetic field measuring device of this type can be produced cost-effectively, especially as it is merely necessary to bend flat-conductor electrodes of a conventional magnetic field sensor and the use of an automatic placement machine can be ensured with the aid of the plastic holder.

A method for producing and populating a circuit board with a magnetic field sensor comprises the following method steps. The first step involves bending flat-conductor electrodes of the magnetic field sensor which protrude from a plastic housing side. A magnetic field sensor is then provided by attaching or injection-molding a plastic holder onto or at the bent flat-conductor electrodes, which magnetic field sensor can also be picked up by an automatic placement machine. Afterward, a circuit board is produced, which can be arranged above a magnetic field gap. An opening is introduced into the circuit board, said opening being matched in terms of contour and size to an apron with a coding element of the magnetic field sensor. Finally, contact areas for the surface mounting of the bent portions of the flat-conductor electrodes are fitted on the circuit board.

Finally, the magnetic field sensor is then introduced into the opening and surface mounting of the magnetic field sensor is carried out with cohesive connection of the bent portions of the flat-conductor electrodes on the top side of the circuit board, wherein the contact areas on the circuit board are cohesively connected to the bent portions. The magnetic field sensor is introduced into the opening in such a way that the plastic housing protrudes at a distance with the semiconductor sensor chip on the underside of the semiconductor chip. This method has the advantage that it can be carried out by means of an automatic placement machine on account of the plastic holder having a smoothed surface region, especially since now the magnetic field sensor can be brought to the different processing positions of an automatic placement machine with the aid of a vacuum pipette.

For introducing the magnetic field sensor into the openings in the circuit board using an automatic placement machine, a plurality of magnetic field sensors are firstly arranged on a tray in rows and columns and are then fed to the automatic placement machine. The magnetic field sensors can be lifted from the tray by means of a vacuum pipette sucking up the smoothed surface region of the plastic holder and can be fed to a placement position on a circuit board by the automatic placement machine. This surface-mountable magnetic field sensor according to various embodiments results in a high automation potential, such that a considerable portion of the previous mounting costs can be saved.

FIG. 1 shows a schematic perspective view of a magnetic field sensor 1 with bent portions 13 to 16 of its flat-conductor electrodes 6 to 9. For this purpose, the flat-conductor electrodes 6 to 9 are bent alternately toward opposite directions A and B, such that the bent portions 13 and 15 of the flat-conductor electrodes 6 and 8 are bent in arrow direction A and the bent portions 14 and 16 of the flat-conductor electrodes 7 and 9 are bent in arrow direction B. These bent portions 13 to 16 can be surface-mounted on a circuit board.

For this purpose, it is advantageous if a vacuum pipette can pick up the bent portions 13 to 16. The magnetic field sensor 1 has, as in FIG. 8, a semiconductor chip 4 having at its edge sides four contact pads 32 to 35, which are electrically connected to the flat-conductor electrodes 6 to 9 by means of connections 36 to 39 still within a plastic housing 11. In order to carry out flat-conductor mounting, the magnetic field sensor shown in FIG. 1 can be suspended with its semiconductor chip 4 in the form of a Hall generator into an opening of corresponding size in a circuit board, wherein contact areas of the printed circuit of the circuit board can be cohesively connected to the bent portions 13 to 16. This cohesive connection can be effected by means of soldering, diffusion welding and/or by a conductive adhesive. Depending on the size of the flat-conductor electrodes 6 to 9 and the bent portions 13 to 16, it is difficult for vacuum tweezers to pick up the magnetic field sensor 1 in accordance to FIG. 1, especially since the bent portions 13 to 16 are widely spaced apart from one another.

Figure 2:
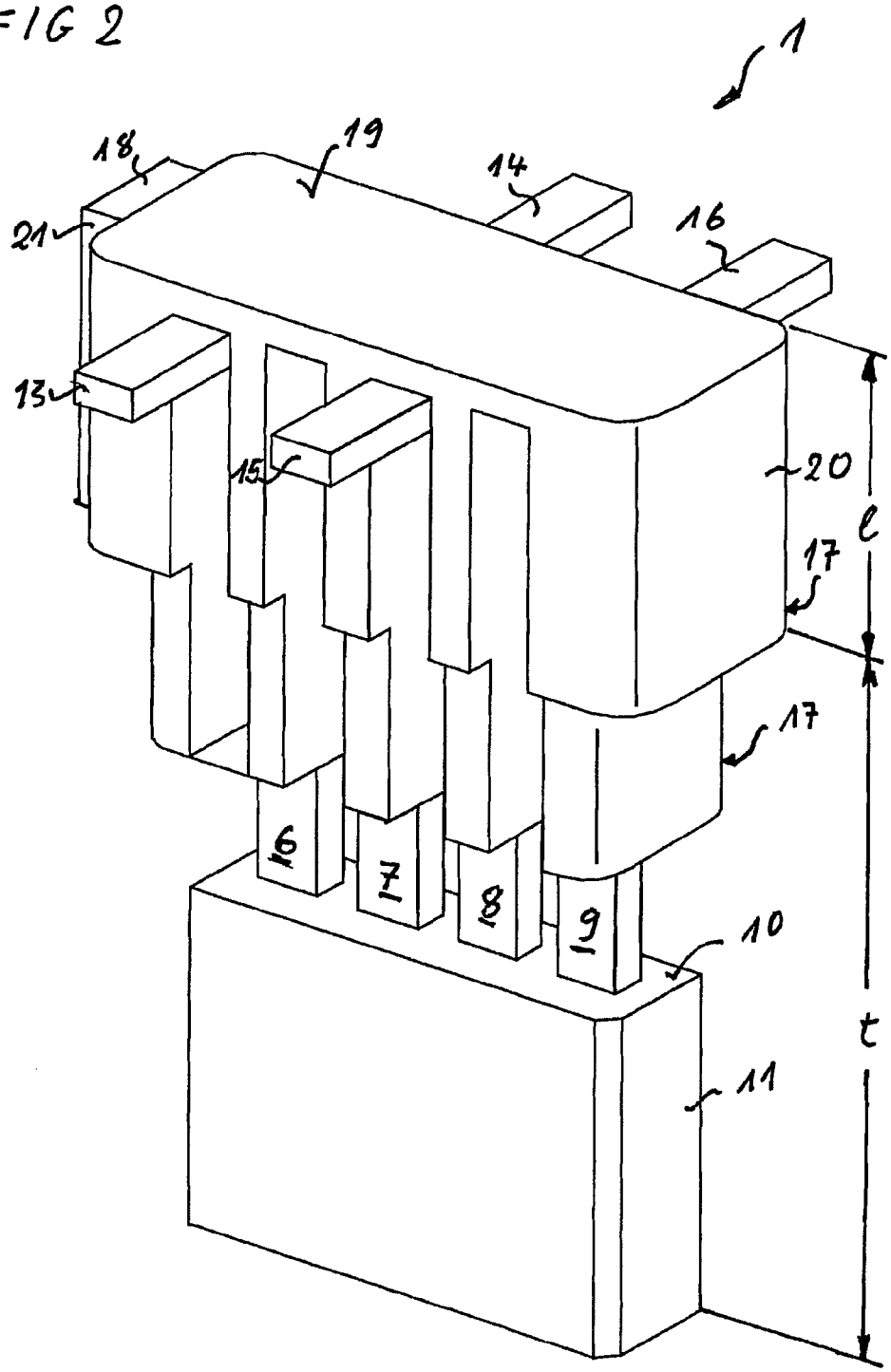
FIG. 2 shows a schematic perspective view of the magnetic field sensor in accordance with FIG. 1 after fitting of a plastic holder for the bent flat-conductor electrodes in accordance with a first embodiment.

FIG. 2 shows a schematic perspective view of the magnetic field sensor 1 in accordance with FIG. 1 after the fitting of a plastic holder 17 for the bent flat-conductor electrodes 6 to 9 in accordance with a first embodiment. Said plastic holder 17 can be attached, injection-molded, adhesively bonded or pressed onto the bent portions 13 to 16. The plastic holder has a smoothed surface region 19, onto which a vacuum pipette can be placed in order to handle the magnetic field sensor automatically. The surface region 19 undergoes transition laterally into an apron 20, from which the bent portions 13 to 16 protrude. In addition, the apron 20 has a coding element 18 arranged in a bead-like manner on one of the sides of the apron 20. The depth t with which the magnetic field sensor 1 is intended to descend into a magnetic field gap can be predefined by the length l of the apron 20.

Figure 3:
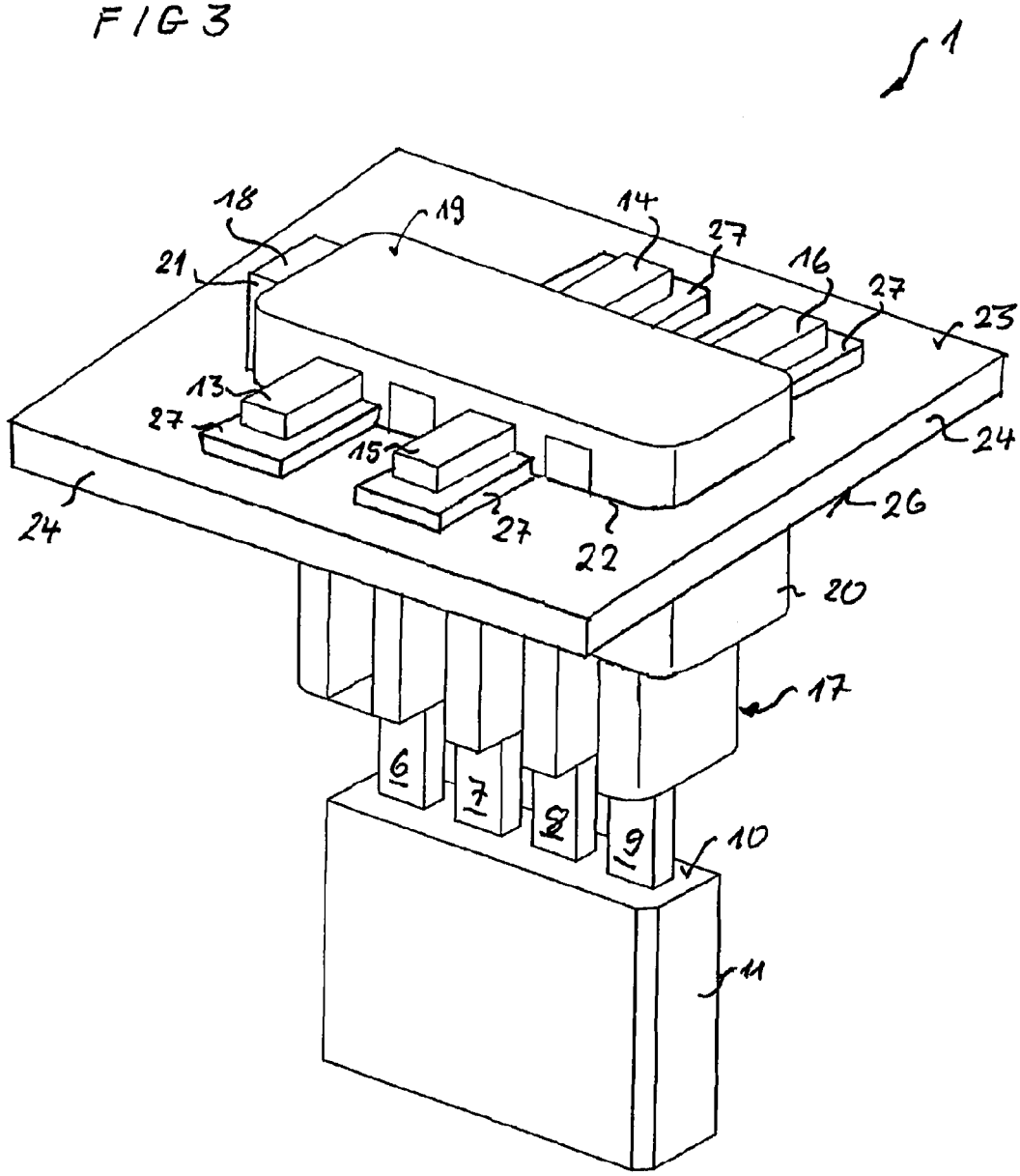
FIG. 3 shows a schematic perspective view of the magnetic field sensor in accordance with FIG. 2 after surface mounting of the magnetic field sensor on a circuit board.

FIG. 3 shows a schematic perspective view of the magnetic field sensor 1 in accordance with FIG. 2 after surface mounting of the magnetic field sensor 1 on a circuit board 24. For this purpose, the circuit board 24 has an opening 22, the contour of which is matched to the contour of the apron 20 with the coding element 18 of the plastic holder 17. A conduction structure having contact areas 27 in the region of the opening 22 is applied on the top side 23 of the circuit board 24. Said contact areas 27 are arranged in a manner corresponding to the bent portions 13 to 16 of the magnetic field sensor 1, such that the bent portions 13 to 16 can be connected to the contact areas 27 cohesively on the top side 23 of the circuit board 24.

Conductive adhesive or soldering methods can be used for this cohesive connection. Therefore, the material of the plastic holder 17 is a plastic whose softening temperature or decomposition temperature is higher than the curing temperature of an adhesive or than the soldering temperature of a soldering connection. Through the opening 22 in the circuit board 24, the magnetic field sensor 1 can be inserted into the circuit board 24, such that the housing 11 protrudes with the semiconductor chip from the underside 26 of the circuit board 24 and can be inserted in a magnetic field gap.

Figure 4:
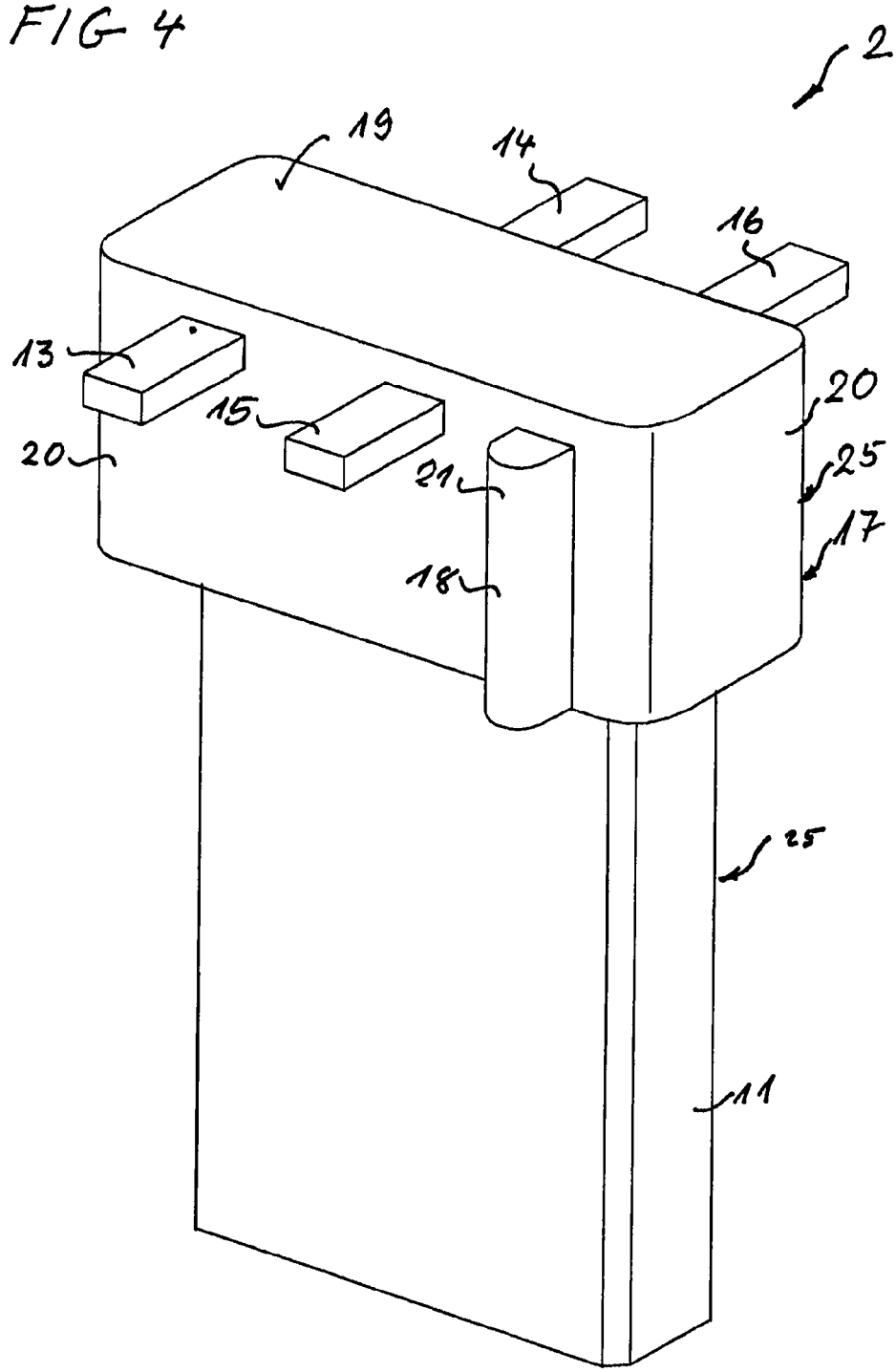
FIG. 4 shows a schematic perspective view of a magnetic field sensor in accordance with a second embodiment.

FIG. 4 shows a schematic perspective view of a magnetic field sensor 2 in accordance with a second embodiment. Components having the same functions as in the previous figure are identified by the same reference symbols and are not then discussed separately. In the case of this magnetic field sensor 2, the plastic holder 17 and the plastic housing 11 have an integral encapsulation 25 of the flat-conductor electrodes, of the semiconductor chip and of the flat-conductor substrate. Consequently, the integral encapsulation 25, from which the bent portions 13 to 16 of the flat-conductor electrodes protrude, forms a new component housing for the magnetic field sensor 2 in accordance with the second embodiment. The coding element 18 at the apron 20 is once again embodied as a bead 21 in order to ensure a correct alignment of the magnetic field sensor 2 in an opening in a circuit board.

Figure 5:
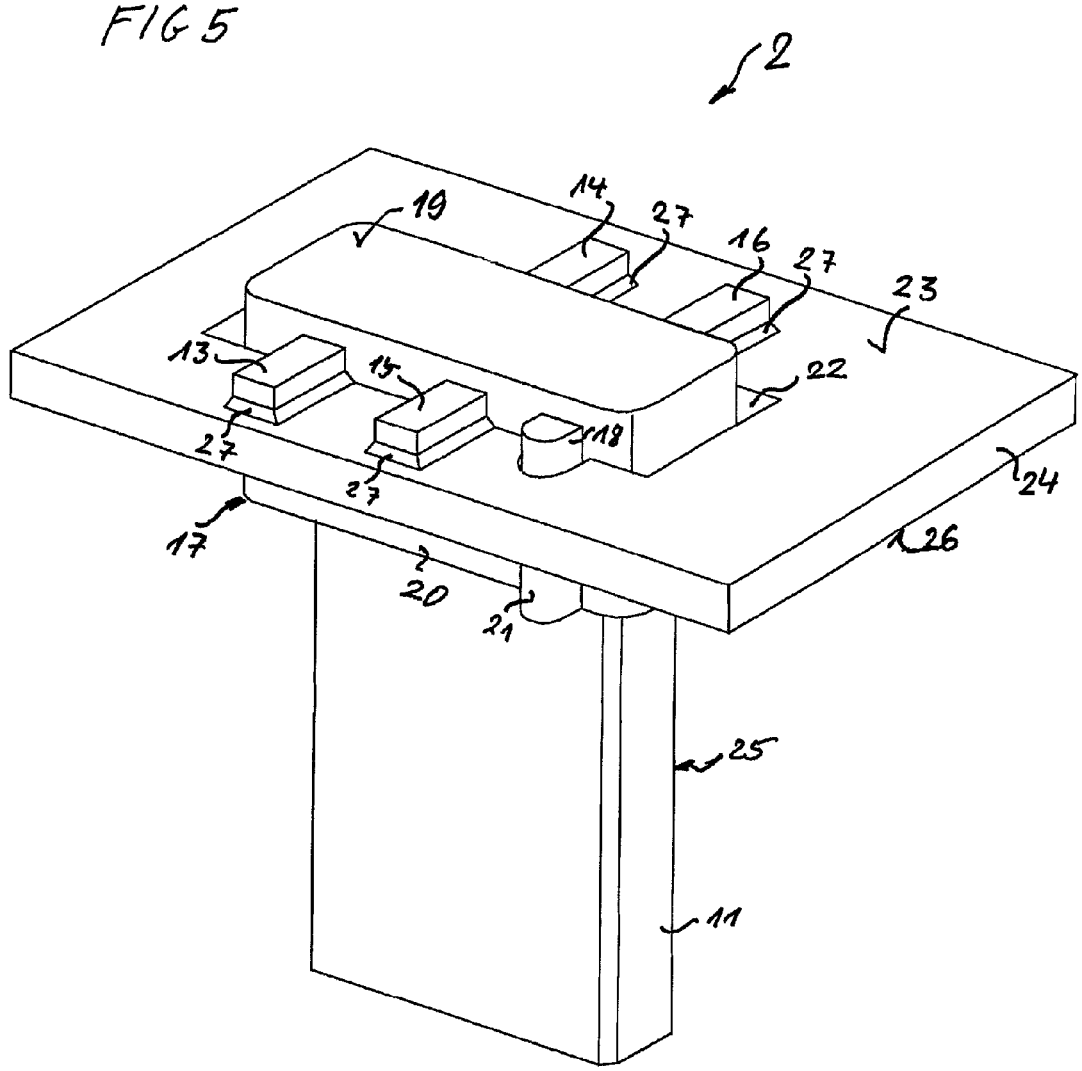
FIG. 5 shows a schematic perspective view of the magnetic field sensor in accordance with FIG. 4 after surface mounting of the magnetic field sensor on a circuit board.

FIG. 5 shows a schematic perspective view of the magnetic field sensor 2 in accordance with FIG. 4 after surface mounting of the magnetic field sensor 2 on a circuit board 24.

In this case, the encapsulation 25 protrudes from the underside 26 of the circuit board 24, while the bent portions 13 to 16 of the flat-conductor electrodes are surface-mounted onto corresponding contact areas 27 in the region of the opening 22 in the circuit board 24.

Figure 6:
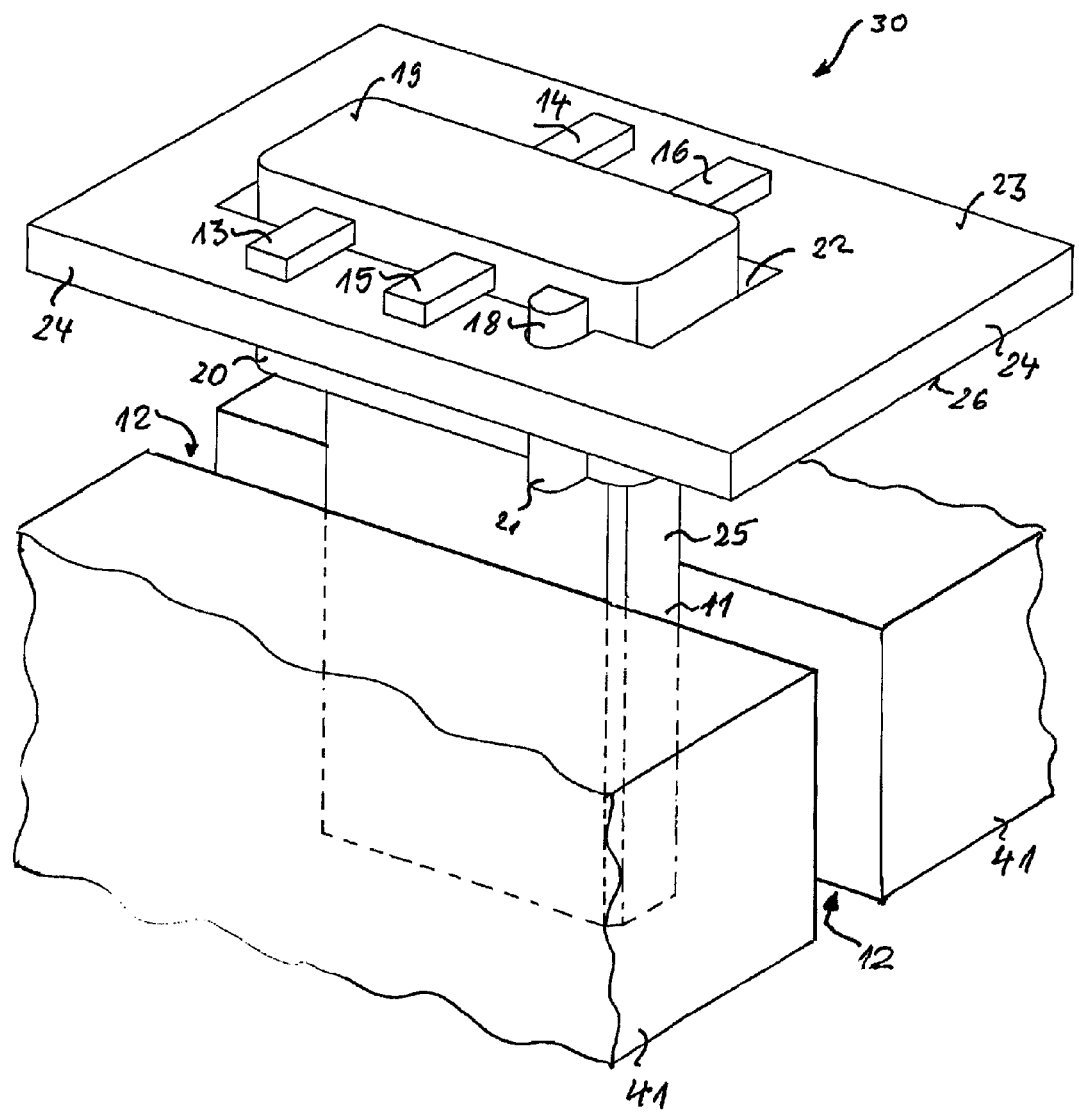
FIG. 6 shows a schematic perspective view of a magnetic field measuring device with a magnetic field sensor in accordance with FIG. 4.

FIG. 6 shows a schematic perspective view of a magnetic field measuring device 30 according to various embodiments with a magnetic field sensor 2 in accordance with FIG. 4. In the case of this magnetic field measuring device 30, the magnetic field sensor 2 is inserted with the encapsulation 25 into a magnetic field gap 12 of a soft-magnetic ring 41, which, for its part, surrounds a current-carrying line (not shown), such that the current through the conductor which is surrounded by the soft-magnetic material 41 can be detected by means of the measurement of the magnetic flux in the magnetic field gap 12.

Figure 7:
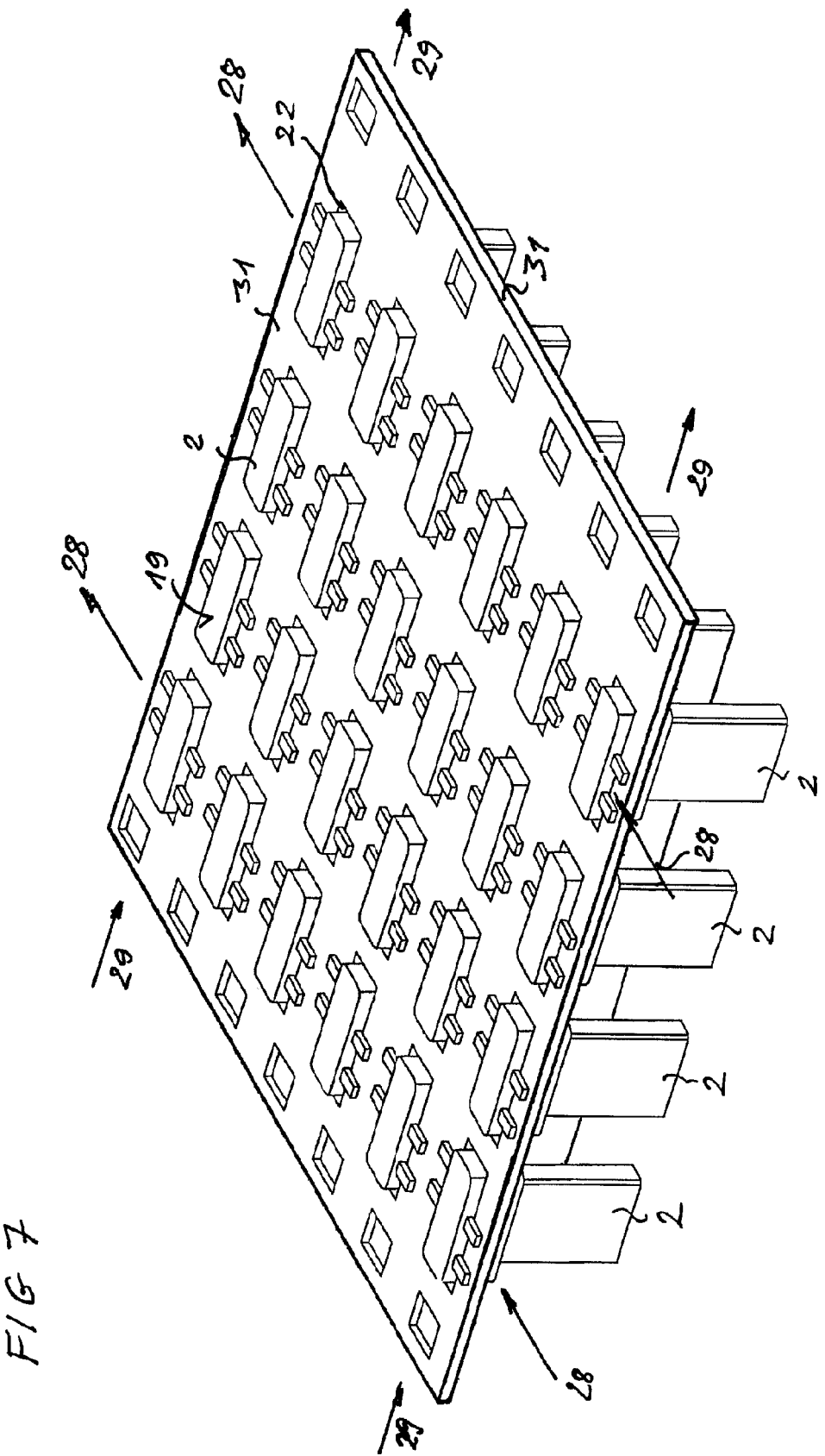
FIG. 7 shows a schematic perspective view of a tray with positioned magnetic field sensors in accordance with FIG. 2 or FIG. 4 for feeding for an automatic placement machine.

FIG. 7 shows a schematic perspective view of a tray 31 with positioned magnetic field sensors 1 or 2 in accordance with FIG. 2 or FIG. 4 for feeding the magnetic field sensors 1 or 2 into an automatic placement machine. On a tray 31 of this type, the magnetic field sensors 2 are arranged in rows 29 and columns 28 and in this example are suspended in openings 22, from which they can be lifted out with the aid of vacuum tweezers in each case, wherein the vacuum tweezers can be placed on the smoothed surface regions 19 of the magnetic field sensors 2 according to various embodiments and can be fed to the automatic placement machine.

Figure 9:
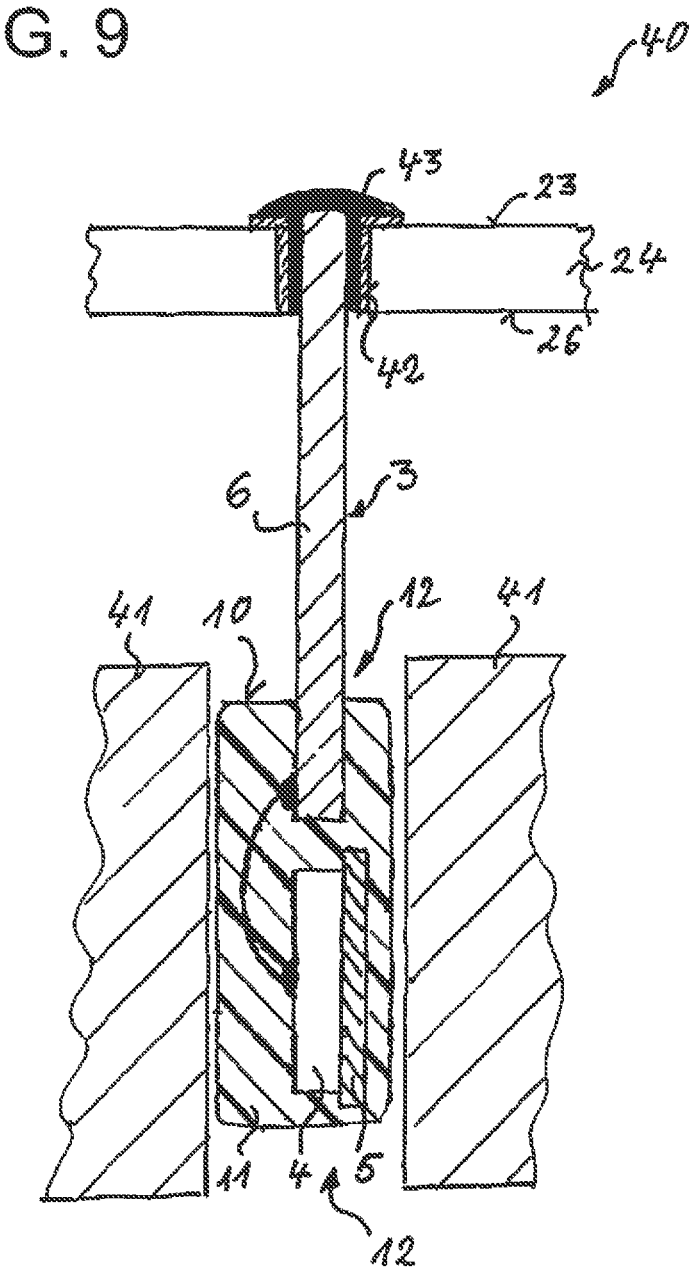
FIG. 9 shows a schematic cross section through a conventional magnetic field measuring device with a magnetic field sensor in accordance with FIG. 8.

FIG. 8 shows, as already explained in the introduction, a schematic perspective view of a first magnetic field sensor 3 in accordance with the prior art. FIG. 9 shows a schematic cross section through a magnetic field measuring device 40 with the magnetic field sensor 3 in accordance with FIG. 8. FIG. 10 additionally shows a schematic cross section through a magnetic field measuring device 50 with a surface-mountable further magnetic field sensor in accordance with the prior art. In respect thereof, reference is made to the introductory description concerning the prior art.

What is claimed is:
1. A surface-mountable magnetic field sensor comprising:
a semiconductor chip on a flat-conductor substrate, and
at least three flat-conductor electrodes protruding from a plastic housing,
wherein the semiconductor chip and the flat-conductor substrate are embedded into the plastic housing,
wherein the plastic housing can be inserted with the embedded semiconductor chip into a magnetic field gap, with the flat-conductor electrodes protruding, and
wherein each of the at least three flat-conductor electrodes has a protruding portion protruding from a plastic housing, a lateral portion extending laterally to the protruding portion, and a bent section connecting the lateral portion and protruding portion,
wherein the bent sections of the flat-conductor electrodes are arranged in a plastic holder, and the lateral portions of the flat-conductor electrodes extend from the plastic holder in different directions, and
wherein the lateral sections of the flat-conductor electrodes are surface-mountable on a circuit board when the plastic holder is inserted through an opening in the circuit board.

2. The magnetic field sensor according to claim 1, wherein the plastic holder has a coding element.

3. The magnetic field sensor according to claim 2, wherein the plastic holder with the coding element is arranged in a matched opening at an angle with respect to a top side of the circuit board, and wherein the plastic housing projects at said angle from the top side of the circuit board.

4. The magnetic field sensor according to claim 1, wherein the plastic holder has a smoothed surface region, which is smoothed for picking up the magnetic field sensor by means of a suction pipette.

5. The magnetic field sensor according to claim 4, wherein the plastic holder has an apron fitted laterally with respect to the surface region, from which apron the bent portions of the flat-conductor electrodes protrude, and wherein the apron has a bead as coding element.

6. The magnetic field sensor according to claim 1, wherein the magnetic field sensor is a Hall.

7. The magnetic field sensor according to claim 1, wherein the plastic holder and the plastic housing have an integral encapsulation of the flat-conductor electrodes, of the semiconductor chip and of the flat-conductor substrate.

8. The magnetic field sensor according to claim 1, wherein the protruding portions of the flat-conductor electrodes extend parallel to each other, and the lateral portions of the flat-conductor electrodes extend in a common plane.

9. A magnetic field measuring device comprising:
a circuit board having an opening, and
a magnetic field sensor comprising:
a semiconductor chip on a flat-conductor substrate, and
at least three flat-conductor electrodes protruding from a plastic housing,
wherein the semiconductor chip and the flat-conductor substrate are embedded into the plastic housing,
wherein the plastic housing can be inserted with the embedded semiconductor chip into a magnetic field gap, with the flat-conductor electrodes protruding, and
wherein each of the at least three flat-conductor electrodes has a protruding portion protruding from a plastic housing, a lateral portion extending laterally to the protruding portion, and a bent section connecting the lateral portion and protruding portion,
wherein the bent sections of the flat-conductor electrodes are arranged in a plastic holder, and the lateral portions of the flat-conductor electrodes extend from the plastic holder in different directions, and wherein the plastic holder is inserted through the opening in the circuit board, and the lateral sections of the flat-conductor electrodes are surface mounted on the circuit board.

10. The magnetic field measuring device according to claim 9, wherein the plastic holder has a coding element.

11. The magnetic field measuring device according to claim 10, wherein the plastic holder with the coding element is arranged in a matched opening at an angle with respect to a top side of the circuit board, and wherein the plastic housing projects at said angle from the top side of the circuit board.

12. The magnetic field measuring device according to claim 9, wherein the plastic holder has a smoothed surface region, which is smoothed for picking up the magnetic field sensor by means of a suction pipette.

13. The magnetic field measuring device according to claim 12, wherein the plastic holder has an apron fitted laterally with respect to the surface region, from which apron the lateral portions of the flat-conductor electrodes protrude, and wherein the apron has a bead as coding element.

14. The magnetic field measuring device according to claim 9, wherein the magnetic field sensor is a Hall sensor.

15. The magnetic field measuring device according to claim 9, wherein the plastic holder and the plastic housing have an integral encapsulation of the flat-conductor electrodes, of the semiconductor chip and of the flat-conductor substrate.

16. The magnetic field measuring device of claim 9, wherein the protruding portions of the flat-conductor electrodes of the magnetic field sensor extend parallel to each other, and the lateral portions of the flat-conductor electrodes extend in a common plane.

17. A method for producing and populating a circuit board with a magnetic field sensor, comprising the following method steps:
- bending flat-conductor electrodes of the magnetic field sensor which protrude from a plastic housing side;
- attaching or injection-molding a plastic holder onto or at the bent flat-conductor electrodes;
- producing a circuit board, which can be arranged above a magnetic field gap;
- introducing an opening into the circuit board, which is matched in terms of contour and size to an apron with a coding element of the magnetic field sensor;
- fitting contact areas on the circuit board for the surface mounting of the bent portions of the flat-conductor electrodes; and
- introducing the magnetic field sensor into the opening and surface mounting of the magnetic field sensor with cohesive connection of the bent portions of the flat-conductor electrodes on the top side of the circuit board with the contact areas, in such a way that the plastic housing is arranged with a semiconductor sensor chip at a distance from the underside of the circuit board.

18. The method according to claim 17, wherein the magnetic field sensor is introduced into the opening in the circuit board using an automatic placement machine, wherein a plurality of magnetic field sensors are arranged on a tray and columns and are fed to the automatic placement machine.

19. The method according to claim 18, wherein the magnetic field sensors are lifted from the tray by means of a vacuum pipette sucking up a smoothed surface region of the plastic holder and are fed to a placement position on a circuit board.

* * * * *